(12) United States Patent
Ogawa et al.

(10) Patent No.: US 7,117,412 B2
(45) Date of Patent: Oct. 3, 2006

(54) FLIP-FLOP CIRCUIT FOR CAPTURING INPUT SIGNALS IN PRIORITY ORDER

(75) Inventors: Ryuji Ogawa, Yokohama (JP); Toshiki Morimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 420 days.

(21) Appl. No.: 10/109,405

(22) Filed: Mar. 28, 2002

(65) Prior Publication Data
US 2002/0140479 A1    Oct. 3, 2002

(30) Foreign Application Priority Data
Mar. 29, 2001    (JP) .............................. 2001-096677

(51) Int. Cl.
G01R 31/028    (2006.01)
H03K 3/289    (2006.01)
(52) U.S. Cl. ...................... 714/724; 714/727; 327/202
(58) Field of Classification Search ................ 714/724, 714/726, 729, 733; 327/202, 203, 208, 211; 326/40, 41, 46
See application file for complete search history.

(56) References Cited

U.S. PATENT DOCUMENTS 4,740,970 A     4/1988    Burrows et al.
6,614,276 B1 *  9/2003    Robertson et al. .......... 327/211

* cited by examiner

Primary Examiner—James C. Kerveros
(74) Attorney, Agent, or Firm—DLA Piper Rudnick Gray Cary US LLP

(57) ABSTRACT

A flip-flop circuit includes first and second logic gates, a first selection circuit and a latch circuit. The first logic gate executes a logic operation on a first data signal and a first control signal. The second logic gate executes a logic operation on a second data signal and the first control signal. The operation results of the first and second logic gates are forcibly fixed to a predetermined value irrespective of the first and second data signals, if the first control signal is asserted. A first selection circuit selects one of the operation results of the first and second logic gates, and outputs the selected operation result as a first selection signal. A latch circuit latches the first selection signal.

14 Claims, 8 Drawing Sheets

FLIP-FLOP CIRCUIT FOR CAPTURING INPUT SIGNALS IN PRIORITY ORDER

CROSS-REFERENCE TO RELATED APPLICATIONS

This application is based upon and claims the benefit of priority from the prior Japanese Patent Application No. 2001-096677, filed Mar. 29, 2001, the entire contents of which are incorporated by reference.

BACKGROUND OF THE INVENTION

1. Field of the Invention

The present invention relates to a flip-flop circuit, and more particularly to a flip-flop circuit capable of preventing data signal propagation delays by reducing the number of stages of logic circuits located on a data signal input path.

2. Description of the Related Art

A CMOS flip-flop circuit, provided with three functions for a test operation, clear operation and output feedback operation in addition to data input operation, is widely used in a semiconductor integrated circuit. Referring to FIG. 1A, a CMOS flip-flop circuit will be described. FIG. 1A is a circuit diagram illustrating a CMOS flip-flop circuit.

As shown, the CMOS flip-flop circuit 1 mainly comprises an input signal selection section 2 and a latch circuit 3. The input signal selecting section 2 includes selection circuits 2-1–2-3 and inverters 2-4 and 2-5. The selection circuit 2-1 is a multiplexer, for example. This circuit selects either the inverted output signal QN of the CMOS flip-flop or an input data signal DI inverted by the inverter 2-4. The selection circuit 2-2 is a NAND gate, for example. This circuit selects either the signal selected by the selection circuit 2-1 or a reset signal RN inverted by the inverter 2-5. The selection circuit 2-3 is a multiplexer, for example. This circuit selects either the signal selected by the selection circuit 2-2 or a test signal TI. The latch circuit 3 is of a master-slave type, for example. This circuit latches the signal selected by the selection circuit 2-3.

The usual operation of the CMOS flip-flop circuit 1 constructed as above is the data input operation. When executing the data input operation, an enable signal Enb for controlling the selection circuit 2-1 is asserted. As a result, the selection circuit 2-1 selects the input data signal DI inverted by the inverter 2-4. The input data signal DI is latched by the latch circuit 3 via the selection circuits 2-2 and 2-3.

When executing the clear operation, the reset signal RN is asserted. As a result, the output of the selection circuit 2-2 is forcibly fixed. The output signal of the selection circuit 2-2 is latched by the latch circuit 3 via the selection circuit 2-3. Thus, the data latched by the latch circuit 3 is reset.

When executing the test operation, a test enable signal TE input to the selection circuit 2-3 is asserted. As a result, the selection circuit 2-3 selects the test signal TI, and the latch circuit 3 latches the test signal TI.

Further, the CMOS flip-flop circuit 1 executes an output feedback operation in addition to the aforementioned three operations. The output feedback operation is executed to secure an output state even if there is no input signal. When there is no input signal, the selection circuit 2-1 selects the inverted output signal QN of the latch circuit 3. The latch circuit 3 again latches the inverted output signal QN via the selection circuits 2-2 and 2-3.

The order of priority of the four above-mentioned operations is test operation, clear operation and enable/data-input operations. In other words, even if the reset signal RN or input data signal DI is input, the test operation is executed unconditionally as long as the test enable signal TE is asserted. If, on the other hand, the test enable signal is not asserted, the reset operation is executed in preference to the output feedback operation or data input operation.

More specifically, as shown in FIG. 1B, when fixing an order of priority to signals input to the flip-flop circuit, a selection circuit MUX1 is used to select one of two signals IN(1) and IN(2), which have the lowest priority. After that, a selection circuit MUX2 is used to select one of the elected signal and a signal IN(3) having the second lowest priority. Similarly, selection circuits MUX3–MUX(n−2) execute signal selection. The selection circuit MUX(n−1) of the last stage selects either a signal IN(n) of the highest priority or the output signal of the selection circuit MUX(n−2). By virtue of this structure, it can be determined, in accordance with a control signal Cnt(n−1) for the selection circuit MUX(n−1) of the last stage, whether or not the signal IN(n) of the highest priority should be selected, irrespective of the states of the selection circuits MUX1–MUX(n−2).

FIG. 1C is a timing chart illustrating the waveforms of a clock CP and the input data signal DI. The input data signal DI is normally captured by the flip-flop circuit in synchronism with the clock CP. As shown, when the input data signal DI is captured in synchronism with the leading edge of each pulse of the clock CP, it is necessary to input the input data signal DI to the flip-flop circuit before the rise of each pulse of the clock CP. The time required from the input of the input data signal DI to the rise of each pulse of the clock CP is called a "setup time". The reason why the setup time is provided is that determined time is required until the input data signal DI is actually captured by the flip-flop circuit after it is input. Therefore, the longer the input path of the input data signal, the longer the setup time should be.

In the case of the flip-flop circuits shown in FIGS. 1A and 1B, the input path of a signal selected by a selection circuit of a later stage is very long. For example, in the flip-flop circuit shown in FIG. 1A, the input data signal DI must pass through the selection circuits 2-2 and 2-3 before it reaches the latch circuit. Thus, the input path of the input data signal DI is long and hence the setup time should be set long. Where the setup time is long, it may impede an increase in the operation speed of the flip-flop circuit. Furthermore, it requires a large operational margin and hence may make the circuit design complicated.

FIG. 1D is a block diagram illustrating a semiconductor integrated circuit. As shown, the semiconductor integrated circuit comprises flip-flop circuits 1-1–1-4, and logic circuits 4-1–4-2 to be controlled by the outputs of the flip-flop circuits. When executing a test operation, the test signal TI is input to each flip-flop 1-1–1-4, and the test operation is executed in synchronism with the clock CP.

Usually, the propagation speed of the test signal TI is very high since the signal propagates through a test signal path wired by a dedicated wiring method. On the other hand, the clock CP has a skew, which may involve a problem during the operation of each flip-flop. Specifically, there is a case where the test signal TI reaches a flip-flop circuit earlier than the clock CP. For example, in the case of FIG. 1D, the test signal TI reaches each flip-flop 1-1–1-4 circuit earlier than the clock CP. Therefore, it is possible that the reliability of the test operation will be significantly degraded.

This clock skew problem can be solved by inserting a delay cell only in the test signal path. In this case, however, the whole circuit size will be inevitably large, and further, it is necessary to review the design of the entire flip-flop structure so as to insert a delay cell. Therefore, the insertion of a delay cell is not a preferable solution.

BRIEF SUMMARY OF THE INVENTION

A flip-flop circuit according to an aspect of the invention comprises:

a first logic gate which executes a logic operation on a first data signal and a first control signal;

a second logic gate which executes a logic operation on a second data signal and the first control signal, the operation results of the first and second logic gates being forcibly fixed to a predetermined value irrespective of the first and second data signals, if the first control signal is asserted;

a first selection circuit which selects one of the operation results of the first and second logic gates, and outputs the selected operation result as a first selection signal, the first selection circuit selecting the result of the first logic gate when a first enable signal from outside the flip-flop circuit is asserted;

a latch circuit which latches the first selection signal;

a third logic gate which executes a logic operation on a third data signal and a second control signal;

a fourth logic gate which executes a logic operation on a fourth data signal and the second control signal, the operation results of the third and fourth logic gates being forcibly fixed to a predetermined value irrespective of the third and fourth data signals, the second selection circuit selecting the result of the fourth logic gate when a second enable signal from outside the flip-flop circuit is asserted; and a second selection circuit which selects one of the operation results of the third and fourth logic gates, and outputs the selected operation result as a second selection signal, the second selection signal being one of the first and second data signals.

DETAILED DESCRIPTION OF THE INVENTION

Figure 1A:
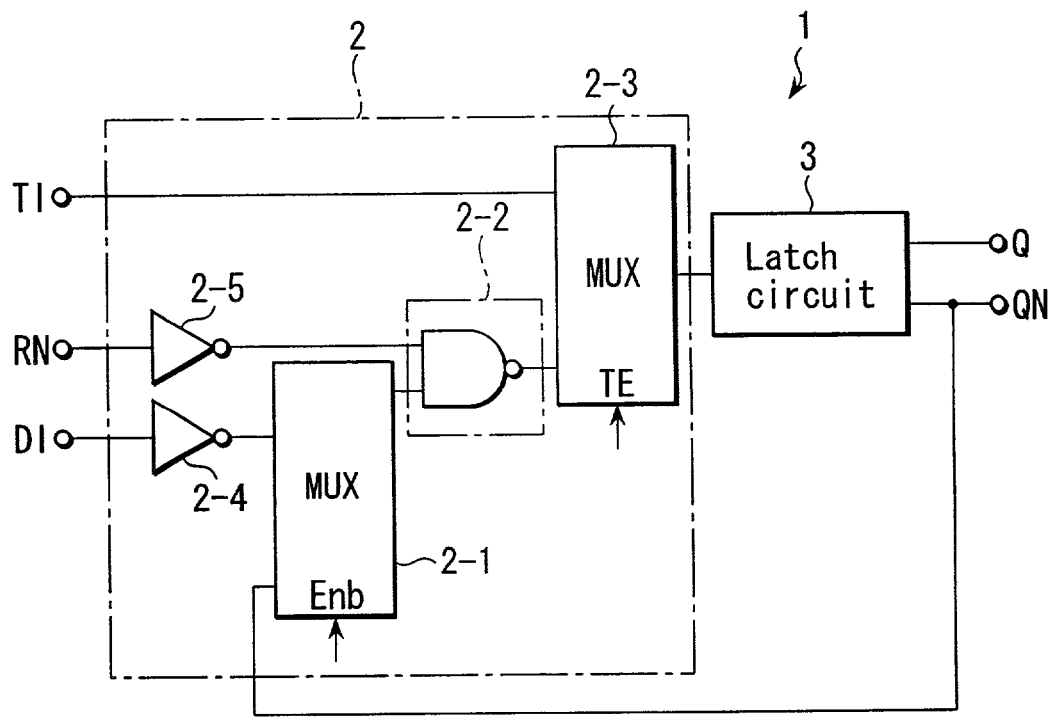
FIGS. 1A and 1B are block diagrams illustrating conventional flip-flop circuits.
Figure 1B:
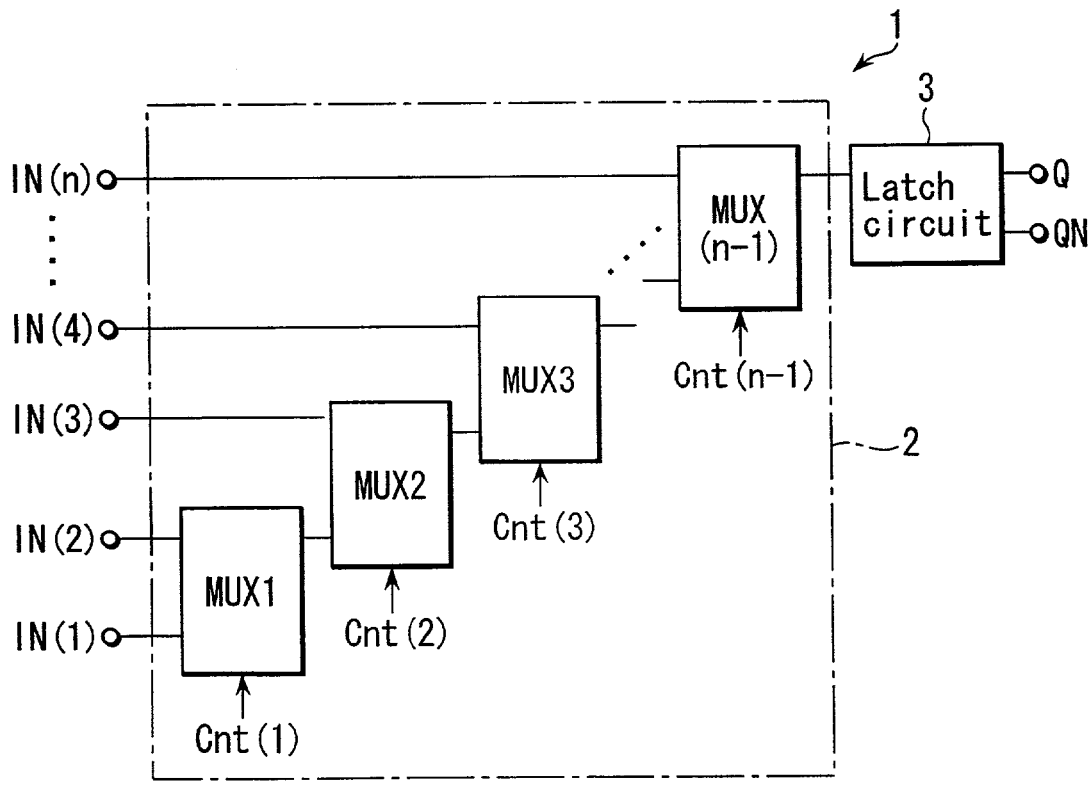
Figure 1C:
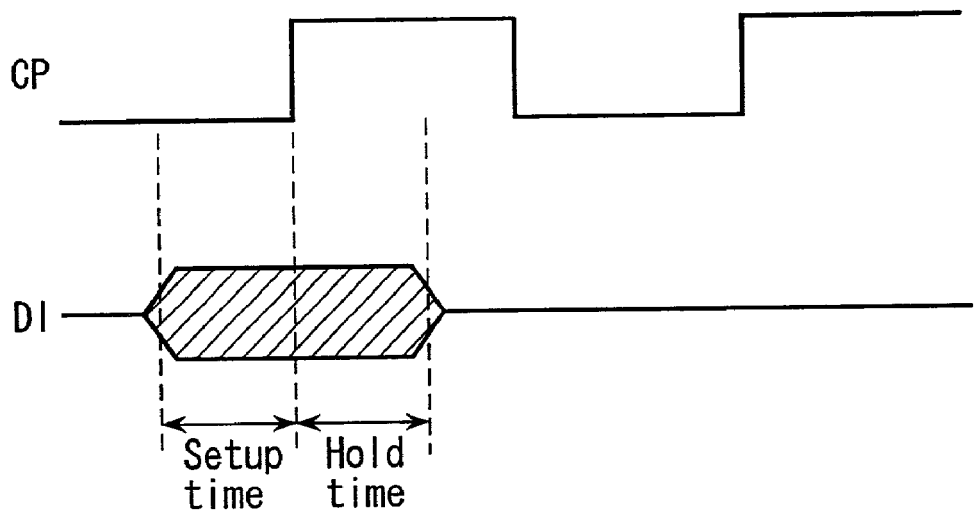
FIG. 1C is a timing chart illustrating a clock and input data signal employed in conventional flip-flop circuit.
Figure 1D:
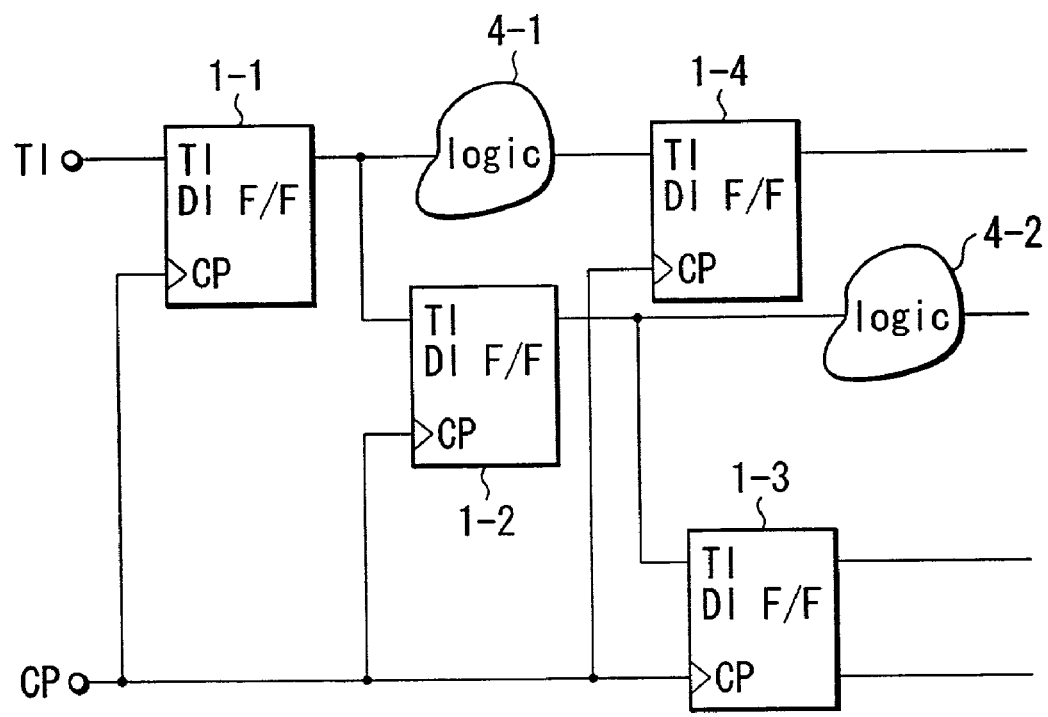
FIG. 1D is a block diagram illustrating a conventional semiconductor integrated circuit.
Figure 2A:
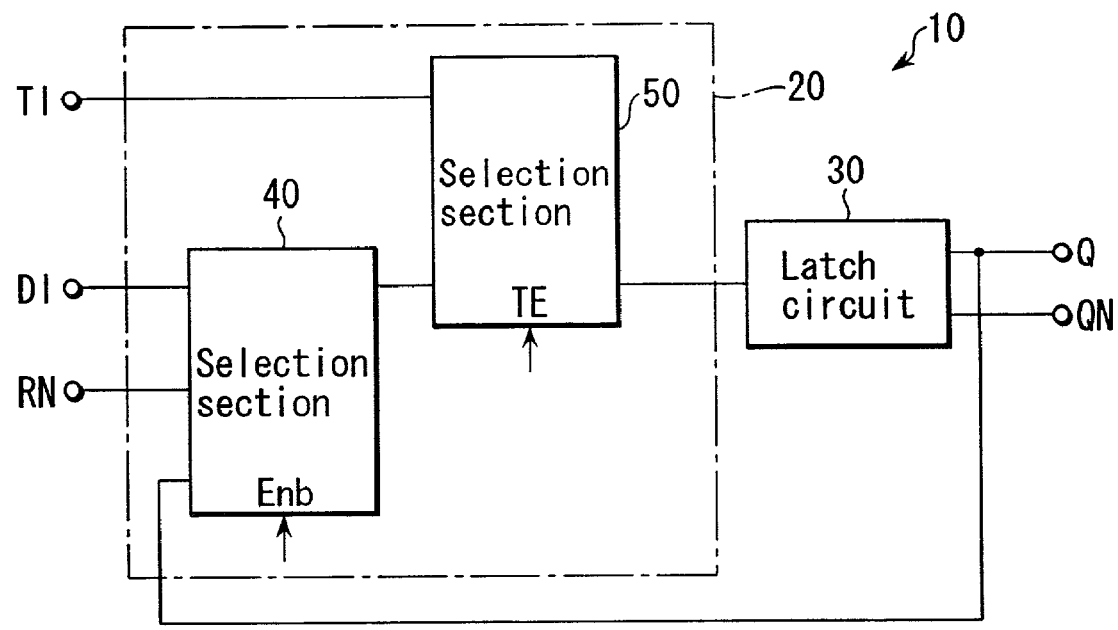
FIG. 2A is a block diagram illustrating a flip-flop circuit according to a first embodiment of the invention.

Referring to FIG. 2A, a flip-flop circuit according to a first embodiment of the invention will be described. FIG. 2A is a conceptual view illustrating a CMOS flip-flop circuit provided with test operation, clear operation and output feedback operation functions in addition to data input operation.

As shown, the CMOS flip-flop circuit 10 mainly comprises an input signal selection section 20 and a latch circuit 30.

The input signal selection section 20 includes selection sections 40 and 50. The selection section 40 selects one of the non-inverted output signal Q of the CMOS flip-flop circuit 10, a reset signal RN and an input data signal DI. The selection section 50 selects either the test signal TI or the signal selected by the selection section 40. The latch circuit 30 latches the signal selected by the selection section 50.

Figure 2B:
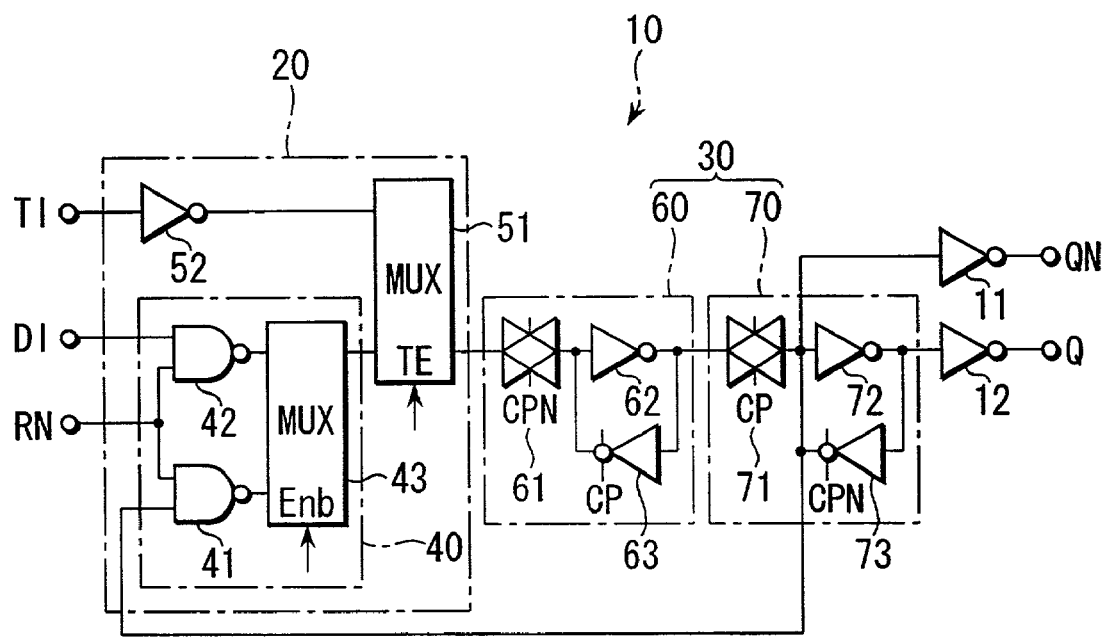
FIG. 2B is a circuit diagram illustrating the flip-flop circuit according to the first embodiment of the invention.

Referring to FIG. 2B, a specific example of the aforementioned flip-flop circuit will be described.

As shown, the selection section 40 includes NAND gates 41 and 42 and a multiplexer 43. The NAND gate 41 executes a NAND operation on the reset signal RN and the non-inverted output signal Q of the flip-flop circuit 10. The NAND gate 42 executes a NAND operation on the reset signal RN and the input data signal DI. The multiplexer 43 selects one of the output signals of the NAND gates 41 and 42.

The selection section 50 includes a multiplexer 51 and an inverter 52. The multiplexer 51 selects either the test signal TI inverted by the inverter 52 or the signal selected by the multiplexer 43.

The latch circuit 30 is a master/slave type latch circuit that includes a master latch circuit 60 and a slave latch circuit 70. The master latch circuit 60 includes a transfer gate 61, inverter 62, and clocked inverter 63. The transfer gate 61 has an input node for inputting the signal selected by the multiplexer 51. The inverter 62 has an input node connected to the output node of the transfer gate 61. The clocked inverter 63 has an input node connected to the output node of the inverter 62, and an output node connected to the input node of the inverter 62. A connection node between the output node of the inverter 62 and the input node of the clocked inverter 63 serves as the output node of the master latch circuit 60.

The slave latch circuit 70 includes a transfer gate 71, inverter 72, and clocked inverter 73. The transfer gate 71 has an input node connected to the output node of the master latch circuit 60. The inverter 72 has an input node connected to the output node of the transfer gate 71. The clocked inverter 73 has an input node connected to the output node of the inverter 72, and an output node connected to the input node of the inverter 72. A connection node between the output node of the inverter 72 and the input node of the clocked inverter 73 serves as the output node of the slave latch circuit 70.

The signal at the input node of the inverter 72 is inverted by the inverter 11 and serves as the inverted output signal QN of the CMOS flip-flop circuit 10. Further, the output signal of the inverter 72 (i.e. the output signal of the slave latch circuit 70) is inverted by the inverter 12 and serves as the non-inverted output signal Q of the CMOS flip-flop circuit 10.

Figure 3A:
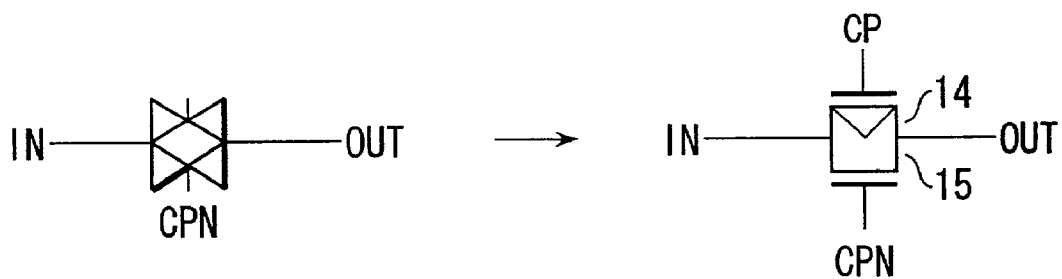
FIG. 3A is a circuit diagram illustrating a transfer gate.
Figure 3B:
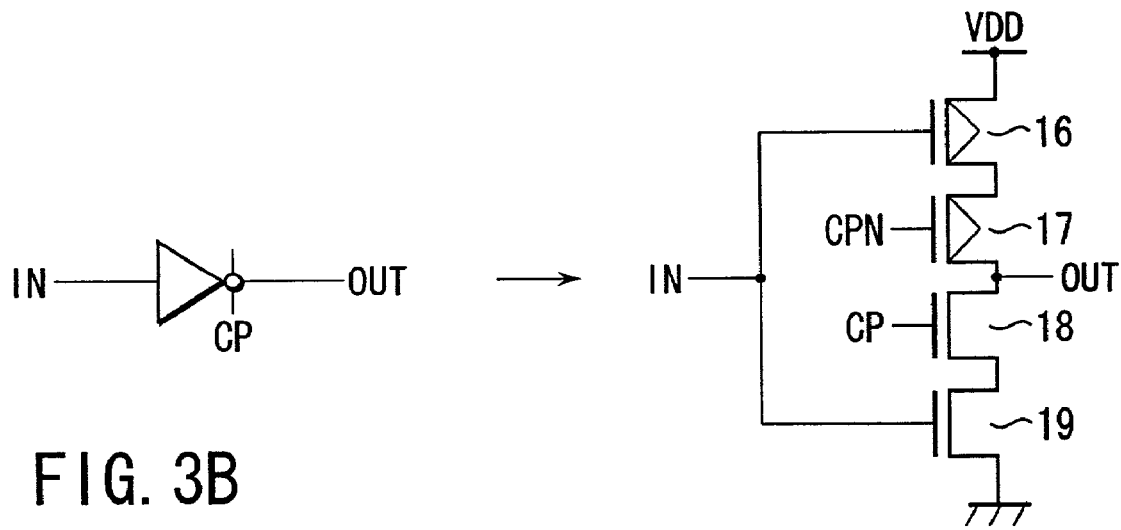
FIG. 3B is a circuit diagram illustrating a clocked inverter.

Referring now to FIGS. 3A and 3B, examples of the transfer gates 61 and 71 and clocked inverters 63 and 73 will be described.

As shown in FIG. 3A, the transfer gate is formed of a PMOS transistor 14 and an NMOS transistor 15 having their sources connected to each other and also drains connected to each other. The clock CP and inverted clock CPN are input to the respective gates of the transistors 14 and 15. FIG. 3A illustrates a structure in which the transfer gate is open when the clock CP is "L (low)". In this case, the clock CP and inverted clock CPN are input to the gates of the PMOS transistor 14 and NMOS transistor 15, respectively. On the other hand, if the transfer gate is open when the clock CP is "H (high)", the inverted clock CPN and clock CP are input to the gates of the PMOS transistor 14 and NMOS transistor 15, respectively.

The clocked inverter includes PMOS transistors 16 and 17 and NMOS transistors 18 and 19. The PMOS transistor 16 has a source connected to a power supply potential VDD, a gate connected to an input terminal IN and a drain. The PMOS transistor 17 has a source connected to the drain of the NMOS transistor 16, a gate for inputting the inverted clock CPN, and a drain. The NMOS transistor 18 has a drain connected to the drain of the PMOS transistor 17, a gate for inputting the clock CP and a source. The NMOS transistor 19 has a drain connected to the source of the NMOS transistor 18, a gate connected to the input terminal IN and a source connected to the ground potential. The connection node between the drains of the PMOS transistor 17 and NMOS transistor 18 serves as the output terminal OUT of the inverter. This structure operates (i.e., outputs an "H" signal) when the clock CP is "H". To operate it when the clock CP is "L", it is sufficient if the clock CP and inverted clock CPN are input to the gates of the PMOS transistor 17 and NMOS transistor 18, respectively.

Figure 3C:
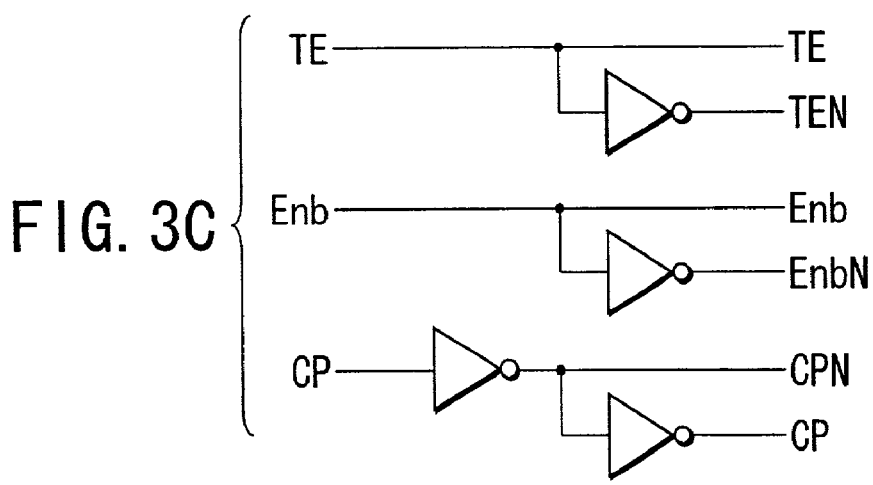
FIG. 3C is a circuit diagram illustrating circuits for generating control signals.

Referring to FIG. 3C, various signals appearing in FIG. 2B will be described. As shown, a signal TEN (inverted test enable signal TEN) is the inverted signal of the test enable signal TE for causing the flip-flop circuit to execute the test operation. A signal EnbN is the inverted signal of the enable signal Enb (inverted enable signal EnbN) for causing the flip-flop circuit to execute the data input operation. The clock CPN is the inverted signal of the clock CP.

In the drawings referred to when explaining the embodiment, the signal name attached to each element indicates that the element is operated or controlled by that signal.

The operation of the CMOS flip-flop circuit 10 constructed as above will be described. The flip-flop circuit 10 can execute, as a main function, the data input operation in which it latches the input data signal DI using the latch circuit 30 and outputs it, and can also execute, as additional functions, the test operation, clear operation and output feedback operation. These operations are prioritized, such that the test operation is of the highest priority, and the clear operation is of the next highest priority.

To execute the data input operation (the usual operation of the flip-flop circuit 10), the enable signal Enb for controlling the multiplexer 43 is asserted, and the data signal DI is input. The multiplexer 43 selects the output of the NAND gate 42 if the enable signal Enb is asserted, and selects the output of the NAND gate 41 if the enable signal Enb is negated. To execute the test operation, the test enable signal TE for controlling the multiplexer 51 is asserted, and the test signal TI is input. The multiplexer 51 selects the test signal TI if the test enable signal TE is asserted, and selects the output of the multiplexer 43 if the test enable signal TE is negated. To execute the reset operation, the reset signal RN is asserted (the signal is set at "L"). In the cases other than the above, the flip-flop circuit 10 executes the output feedback operation.

Each of the aforementioned operations will be described in more detail.

[Data Input Operation]

To execute the data input operation, the enable signal Enb for controlling the multiplexer 43 is asserted, and the data signal DI is input. Further, it is necessary to negate the reset signal RN (to fix it at "H") and also to negate the test enable signal TE for controlling the multiplexer 51.

At this time, since the reset signal RN is "H", the NAND operation result at the NAND gate 42 is determined directly from the data signal DI. Specifically, if the data signal DI is "H", the output of the NAND gate 42 is "L", whereas if the data signal DI is "L", the output of the NAND gate 42 is "H". The same can be said of the NAND gate 41. The output of the NAND gate 41 is determined directly from the non-inverted output signal Q of the flip-flop circuit 10.

The output signals of the two NAND gates 42 and 41 are input to the multiplexer 43. Since the enable signal Enb is asserted during the data input operation, the multiplexer 43 selects the output signal of the NAND gate 42, which is determined by the data signal DI.

The output signal of the NAND gate 42 selected by the multiplexer 43 is input to the multiplexer 51. The multiplexer 51 selects either the signal input from the multiplexer 43 or the test signal TI. Since the test enable signal TE is negated during the data input operation, the multiplexer 51 does not select the test signal TI but selects the output signal of the multiplexer 43.

As a result, the latch circuit 30 latches the output signal of the NAND gate 42 determined by the data signal DI.

As described above, the latch circuit 30 is formed of the master latch circuit 60 and slave latch circuit 70. In the master latch circuit 60, when the clock CP is "L", the transfer gate 61 is open to pass the output signal of the NAND gate 42 therethrough, and the inverter 62 and clocked inverter 63 latch it.

In the slave latch circuit 70, when the clock CP is "H", the transfer gate 71 is open to pass therethrough the output signal of the NAND gate 42 latched by the master latch circuit 60, and the inverter 72 and clocked inverter 73 latch it.

The input signal of the inverter 72 is inverted by the inverter 11 and is output as the inverted output signal QN of the flip-flop circuit 10. Further, the input signal of the inverter 72 is inverted by the inverter 12 and is output as the non-inverted output signal Q of the flip-flop circuit 10.

[Test Operation]

To execute the test operation, it is sufficient if the test enable signal TE for controlling the multiplexer 51 is asserted and the test signal TI is input. In this state, the multiplexer 51 selects the test signal TI inverted by the inverter 52, irrespective of the output signal of the multiplexer 43. As a result, the flip-flop circuit 10 executes the test operation.

[Clear Operation]

To execute the clear operation, the reset signal RN is asserted (set at "L"). Further, it is necessary to negate the test enable signal TE.

If the reset signal RN is "L", the outputs of the NAND gates 41 and 42 are "H" irrespective of the output signal Q and data signal DI. The multiplexer 43 selects the output signal of the NAND gate 41 or 42. Accordingly, the selected signal is always "H". This "H" level output signal is selected by the multiplexer 51 and latched by the latch circuit 30.

Thus, the clear operation, in which the output signal Q is forcibly set constant, is executed by asserting the reset signal RN.

[Output Feedback Operation]

The output feedback operation is executed if none of the above-described operations is executed. Specifically, when any one of the test signal TI, data signal DI and reset signal RN is not input, the flip-flop circuit 10 is in an unstable state. At this time, the output feedback operation is executed to secure a constant output state. In other words, the output feedback operation is executed when all the test enable signal TE, enable signal Enb and reset signal RN are negated.

Suppose that the output signal of the flip-flop circuit 10 assumed immediately before the output feedback operation is "L". In this case, the non-inverted output signal Q input to one of the input terminals of the NAND gate 41 is "L". Further, the reset signal RN input to the other input terminal of the NAND gate 41 is "H". Accordingly, the NAND gate 41 outputs an "H" signal. Since both the multiplexers 43 and 51 select the output signal of the NAND gate 41, the latch circuit 30 latches the "H" signal. As a result, the non-inverted output signal Q and inverted output signal QN are "L" and "H", respectively, which means that the preceding state is maintained.

As described above, the flip-flop circuit of the embodiment can shorten the input path of the data signal DI between the input terminal and latch circuit 30. This shortening is realized by reducing the number of multiplexers necessary for the data signal to reach the latch circuit, from three required in the conventional case to two. This enables the setup time for the data signal to be shortened, and hence enables the operation speed of the semiconductor integrated circuit to increase and the circuit design to be simplified.

Further, the substantially three-input selecting circuit 40 is formed of the NAND gates 41 and 42 and multiplexer 43. Since the logic gates incorporated in the three-input selecting circuit are NAND gates, it is necessary to provide the inverter 52 across the input path of the test signal TI. The inverter 52 also serves as a delay cell for delaying the test signal TI. As described in the section "Background of the Invention", there was a case where the test signal reached each flip-flop earlier than the clock. However, the circuit configuration of this embodiment incorporates the inverter 52 that serves as a delay cell for delaying the propagation of the test signal. As a result, the test signal is delayed to thereby suppress the problem due to the clock skew, resulting in the enhancement of the reliability of the test operation.

Moreover, in the embodiment, the above-mentioned advantage can be achieved without changing the order of priority of the operations. In the test operation, the test signal TI is directly input to the multiplexer 51 of the second stage, and the multiplexer 51 is controlled by the test enable signal TE, thereby executing the test operation as a top priority.

In the clear operation of the second priority, NAND operations are executed on the reset signal, and the data signal DI and non-inverted output signal Q which are used in the other operations. The clear operation is prioritized over the other two operations by causing the multiplexer 43 to select one of the NAND operation results. In the clear operation, the reset signal RN is asserted, and therefore an "L" signal is input to each of the NAND gates 41 and 42. Thus, the outputs of the NAND gates 41 and 42 are forcibly set at "H", and hence the output, selected by the multiplexer 43 on the basis of the enable signal Enb, is always "H". This means that, even during the data input operation or output feedback operation, the clear operation can be inserted by asserting the reset signal RN.

As described above, the test operation of the top priority and the clear operation of the second priority can be realized.

Figure 4:
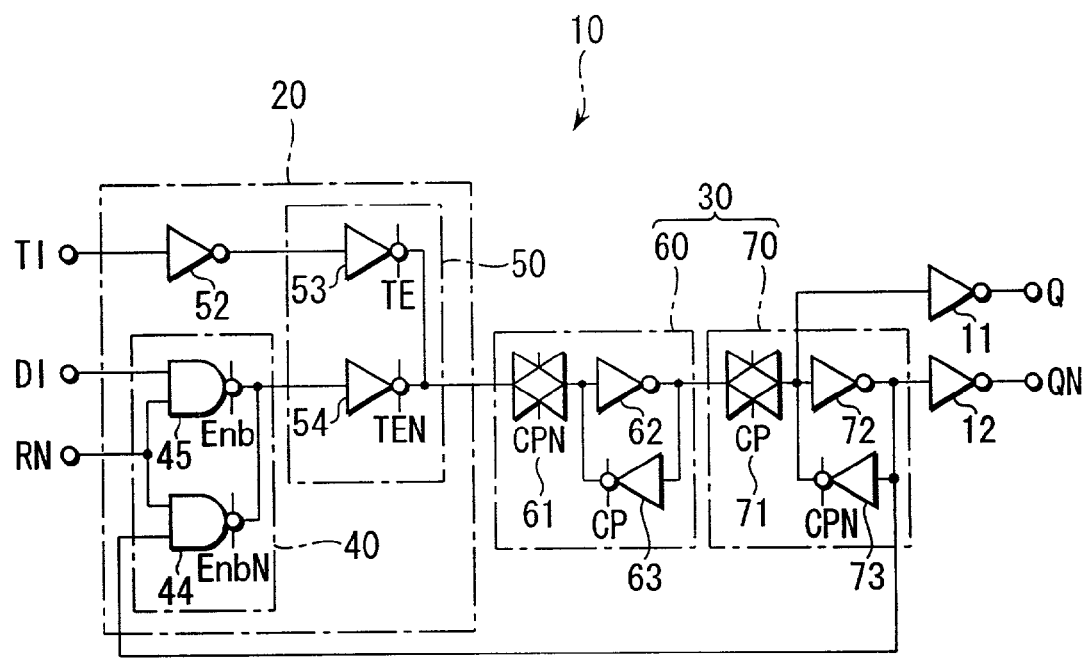
FIG. 4 is a circuit diagram illustrating a flip-flop circuit according to a second embodiment of the invention.

Referring to FIG. 4, a flip-flop according to a second embodiment will be described. FIG. 4 is a circuit diagram illustrating a CMOS flip-flop circuit provided with functions for the test operation, clear operation and output feedback operation in addition to data input operation. In this embodiment, selection sections 40 and 50 similar to those of the first embodiment are realized by other circuits.

As shown, the selection section 40 includes clocked NAND gates 44 and 45. The clocked NAND gate 44 operates when the inverted enable signal EnbN has been asserted (i.e., when the enable signal Enb has been negated). The clocked NAND gate 44 outputs the NAND operation result of the reset signal RN and the non-inverted output signal Q of the flip-flop circuit 10. The clocked NAND gate 45 operates when the enable signal Enb has been asserted. The clocked NAND gate 45 outputs the NAND operation result of the reset signal RN and input data signal DI. The output nodes of the clocked NAND gates 44 and 45 are connected.

The selection section 50 includes clocked inverters 53 and 54. The clocked inverter 53 operates when the test enable signal TE has been asserted. The clocked inverter 53 inverts the test signal TI inverted by the inverter 52. The clocked inverter 54 operates when the inverted test enable signal TEN has been asserted (i.e., when the test enable signal TE has been negated). The clocked inverter 54 inverts a signal at the connection node of the output nodes of the clocked NAND gates 44 and 45. The output nodes of the clocked inverters 53 and 54 are connected.

The operation of the input signal selection section 20 constructed as above will be described. The operation and configuration of the latch circuit 30 are similar to those in the first embodiment, and therefore no description is given thereof.

[Data Input Operation]

When the data input operation is executed, the enable signal Enb is asserted, and the data signal DI is input. Further, it is necessary to negate the reset signal RN (to fix it at "H") and also to negate the test enable signal TE.

At this time, since the enable signal Enb is asserted, the clocked NAND gate 45 is in the operative state, while the clocked NAND gate 44 is in the inoperative state. As a result, the operation result of the clocked NAND gate 45 appears at the connection node of the output nodes of the clocked NAND gates 44 and 45.

Further, since the reset signal RN is "H", the NAND operation result of the clocked NAND gate 45 is determined directly from the data signal DI. In other words, if the data signal DI is "H", the output of the clocked NAND gate 45 is "L", whereas if the data signal DI is "L", the output of the clocked NAND gate 45 is "H".

Further, since the test enable signal TE is negated (i.e., the inverted test enable signal TEN is asserted), the clocked inverter 53 is in the inoperative state, while the clocked inverter 54 is in the operative state. As a result, the inverted signal of the operation result of the clocked NAND gate 45 is output to the connection node of the output nodes of the clocked inverters 53 and 54, and is latched by the latch circuit 30.

[Test Operation]

When the test operation is executed, the test enable signal TE is asserted, and hence the clocked inverter 53 is in the operative state and the clocked inverter 54 is in the inoperative state. As a result, the latch circuit 30 unconditionally latches the test signal TI.

[Clear Operation]

When the clear operation is executed, the reset signal RN is asserted (set at "L") and the test enable signal TE is negated.

In this state, the NAND operation result directly determined from the reset signal RN irrespective of the enable signal Enb is output from either the clocked NAND gate 44 or 45.

Further, since the test enable signal TE is negated (i.e., the inverted test enable signal TEN is asserted), the clocked inverter 53 is in the inoperative state and the clocked inverter 54 is in the operative state. The inverted signal of the operation result of the clocked NAND gate 44 or 45 is output to the connection node of the output nodes of the clocked inverters 53 and 54, thereby resetting the output of the flip-flop circuit 10.

[Output Feedback Operation]

When the output feedback operation is executed, the test enable signal TE, enable signal Enb and reset signal RN are negated.

Accordingly, the clocked NAND gate 45 is in the inoperative state, and the clocked NAND gate 44 is in the operative state. Further, since the reset signal RN is negated, the inverted signal of the NAND operation result of the clocked NAND gate 44, directly determined from the output signal Q, is latched by the latch circuit 30 via the operating clocked inverter 54.

As described above, the circuit shown in FIG. 4 can operate in the same manner and provide the same advantage as the first embodiment.

Figure 5:
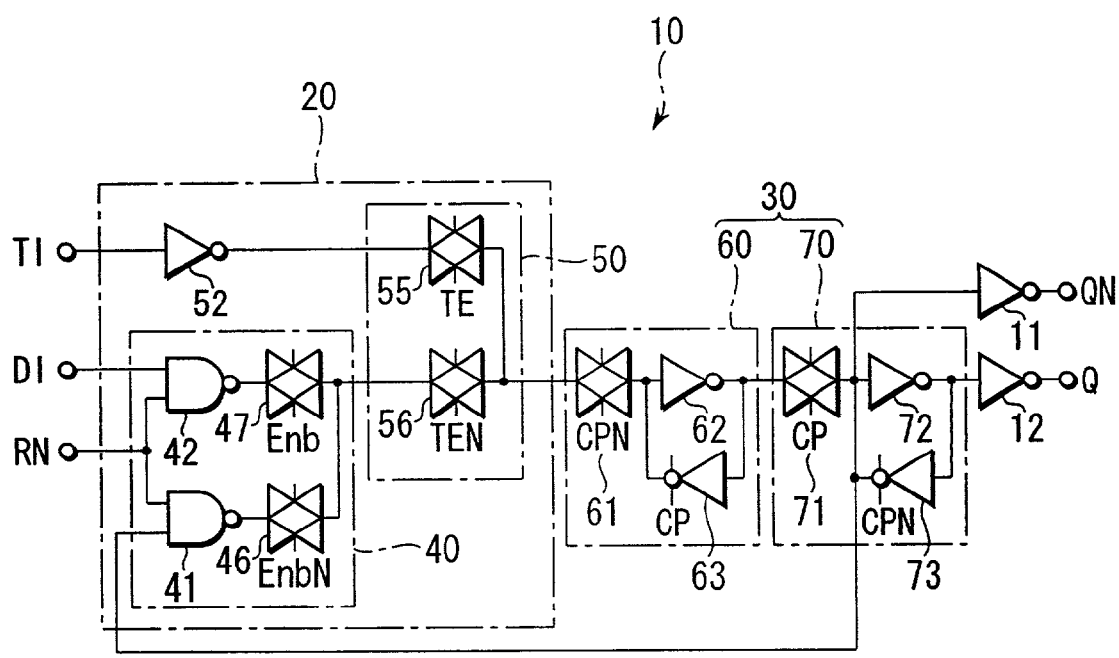
FIG. 5 is a circuit diagram illustrating a flip-flop circuit according to a third embodiment of the invention.

Referring to FIG. 5, a flip-flop according to a third embodiment will be described. FIG. 5 is a circuit diagram illustrating a CMOS flip-flop circuit provided with functions for the test operation, clear operation and output feedback operation in addition to data input operation. In this embodiment, selection sections 40 and 50 similar to those of the first or second embodiment are realized by other circuits.

As shown, the selection section 40 includes NAND gates 41 and 42 and transfer gates 46 and 47. The NAND gate 41 executes a NAND operation on the reset signal RN and the non-inverted output signal Q of the flip-flop circuit 10. The NAND gate 42 executes a NAND operation on the reset signal RN and input data signal DI. The transfer gate 46 has an input node connected to the output node of the NAND gate 41. The transfer gate 46 is open if the enable signal Enb is negated (i.e., if the inverted enable signal EnbN is asserted). The transfer gate 47 has an input node connected to the output node of the NAND gate 42. The transfer gate 47 is open if the enable signal Enb is asserted. The output nodes of both the transfer gates 46 and 47 are connected to each other.

The selection section 50 includes transfer gates 55 and 56. The transfer gate 55 has an input node for inputting the test signal TI inverted by the inverter 52. The transfer gate 55 is open if the test enable signal TE is asserted. The transfer gate 56 has an input node connected to the connection node of the output nodes of the transfer gates 46 and 47. The transfer gate 56 is open if the test enable signal TE is negated (i.e., the inverted test enable signal TEN is asserted). The output nodes of both the transfer gates 55 and 56 are connected to each other.

The operation of the input signal selection section 20 constructed as above will be described. The operation and configuration of the latch circuit 30 are similar to those in the first embodiment, and therefore no description is given thereof.

[Data Input Operation]

When the data input operation is executed, the enable signal Enb is asserted, the reset signal RN is negated (i.e., it is fixed at "H") and the test enable signal TE is also negated. Accordingly, the transfer gates 47 and 56 are open, while the transfer gates 46 and 55 are closed.

Therefore, the path extending from the NAND gate 42 to the latch circuit 30 can be used. Further, since the reset signal RN is negated, the operation result of the NAND gate 42 is determined from the data signal DI. The latch circuit 30 latches the operation result of the NAND gate 42.

[Test Operation]

When the test operation is executed, the test enable signal TE is asserted, and hence the transfer gate 55 is opened and the transfer gate 56 is closed. As a result, the latch circuit 30 unconditionally latches the inverted signal of the test signal TI.

[Clear Operation]

When the clear operation is executed, the reset signal RN is asserted (set at "L") and the test enable signal TE is negated. In this state, the transfer gates 55 and 56 are closed and open, respectively. Further, either the transfer gate 46 or 47 is open due to the enable signal Enb.

As a result, the latch circuit 30 latches the NAND operation result, directly determined from the reset signal RN, via either the transfer gate 46 or 47 that is open, thereby resetting the output of the flip-flop circuit 10.

[Output Feedback Operation]

When the output feedback operation is executed, the test enable signal TE, enable signal Enb and reset signal RN are negated. In this state, the transfer gates 46 and 56 are open, while the transfer gates 47 and 55 are closed.

As a result, the latch circuit 30 latches, via the transfer gates 46 and 56, the NAND operation result of the NAND gate 41 directly determined from the output signal Q.

As described above, the circuit shown in FIG. 5 can operate in the same manner and provide the same advantage as the first embodiment.

Figure 6A:
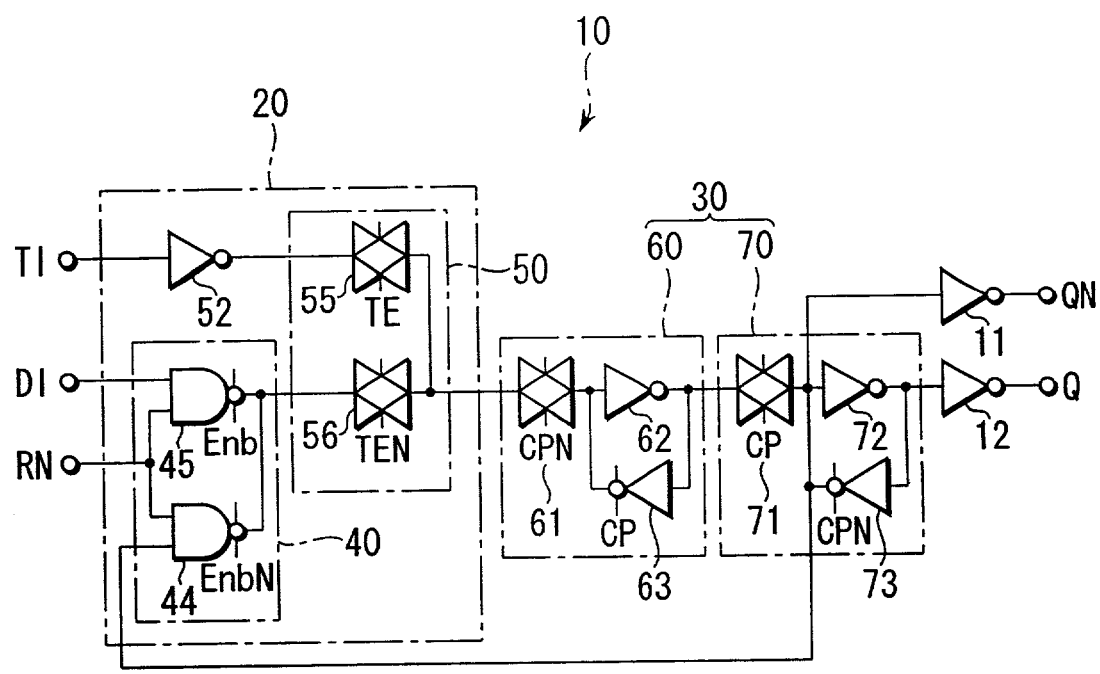
FIGS. 6A and 6B are circuit diagrams illustrating flip-flop circuits according to a fourth embodiment of the invention.
Figure 6B:
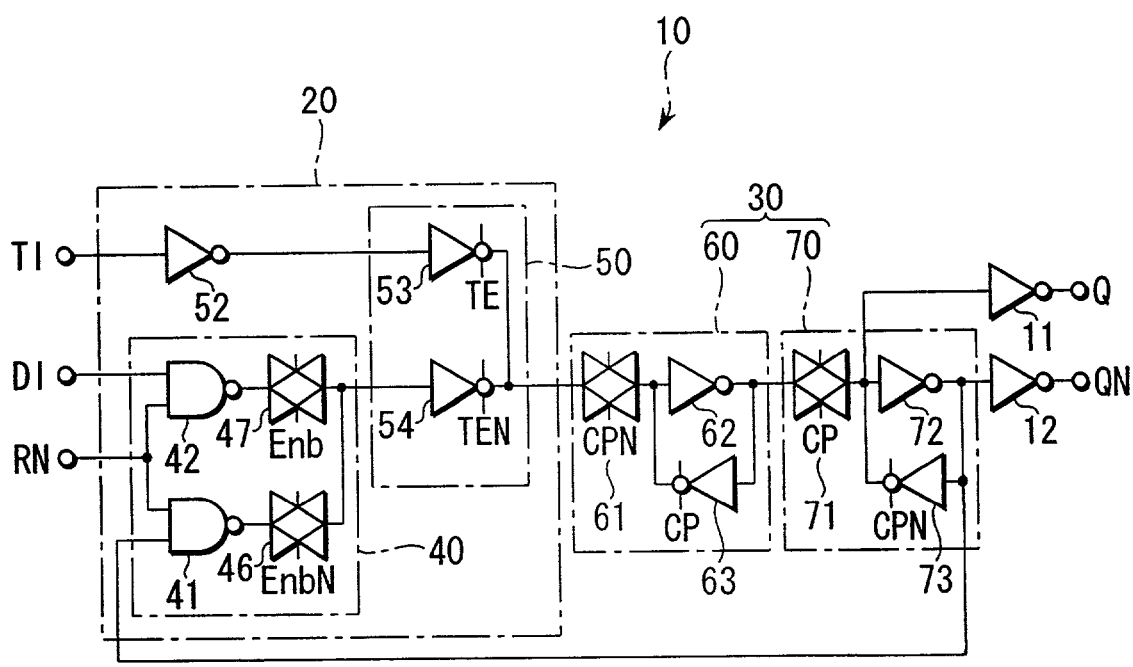

Referring to FIGS. 6A and 6B, flip-flop circuits according to a fourth embodiment will be described. FIGS. 6A and 6B are circuit diagrams illustrating CMOS flip-flop circuits each provided with functions for the test operation, clear operation and output feedback operation in addition to data input operation. Each of the flip-flop circuits of the fourth embodiment incorporates selection sections 40 and 50 formed by combining the corresponding elements of the second and third embodiments.

Specifically, in the flip-flop circuit 10 shown in FIG. 6A, the selection section 40 is formed of the clocked NAND gates 44 and 45 employed in the second embodiment, and the selection section 50 is formed of the transfer gates 55 and 56 employed in the third embodiment.

Further, in the flip-flop circuit 10 shown in FIG. 6B, the selection section 40 is formed of the NAND gates 41 and 42 employed in the third embodiment, and the selection section 50 is formed of the clocked inverters 53 and 54 employed in the second embodiment.

These circuits can operate in the same manner and provide the same advantage as the first embodiment.

Figure 7A:
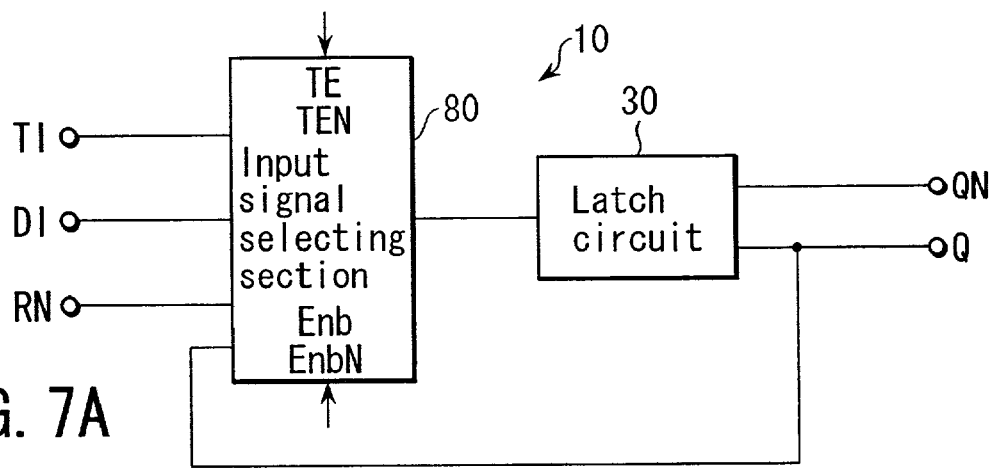
FIG. 7A is a block diagram illustrating a flip-flop circuit according to a fifth embodiment of the invention.

Referring to FIG. 7A, a flip-flop circuit according to a fifth embodiment will be described. FIG. 7A is a block diagram illustrating a CMOS flip-flop circuit provided with functions for the test operation, clear operation and output feedback operation in addition to data input operation.

As shown, the CMOS flip-flop circuit 10 mainly comprises a four-input input signal selection section 80 and a latch circuit 30.

Figure 7B:
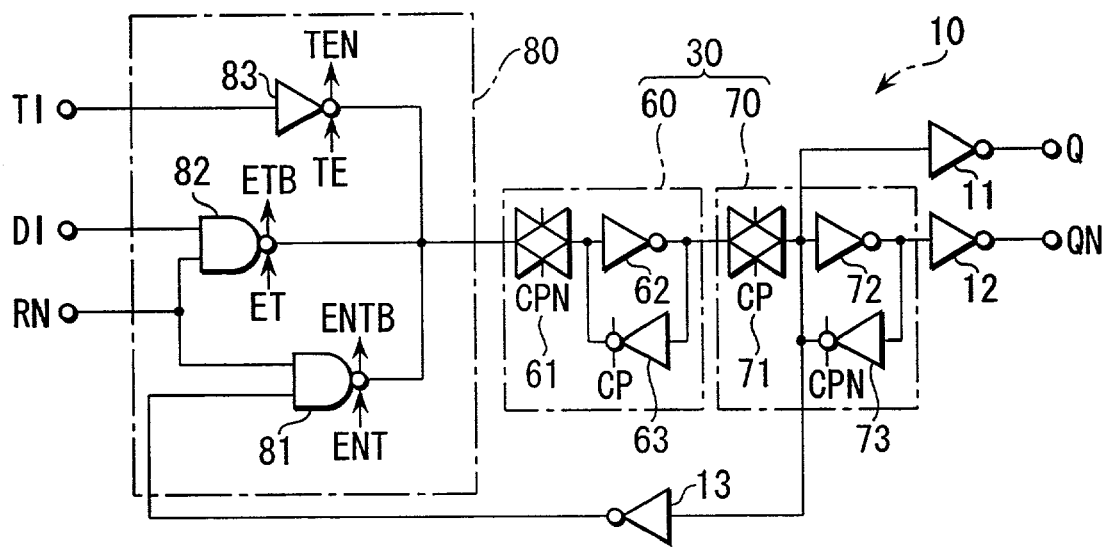
FIG. 7B is a circuit diagram of the flip-flop circuit according to the fifth embodiment of the invention.

Referring to FIG. 7B, a more specific example of the CMOS flip-flop circuit will be described. FIG. 7B is a circuit diagram illustrating a CMOS flip-flop circuit provided with functions for the test operation, clear operation and output feedback operation in addition to data input operation. Since the latch circuit 30 has the same structure as that of the first embodiment, no description is given thereof.

Figure 7C:
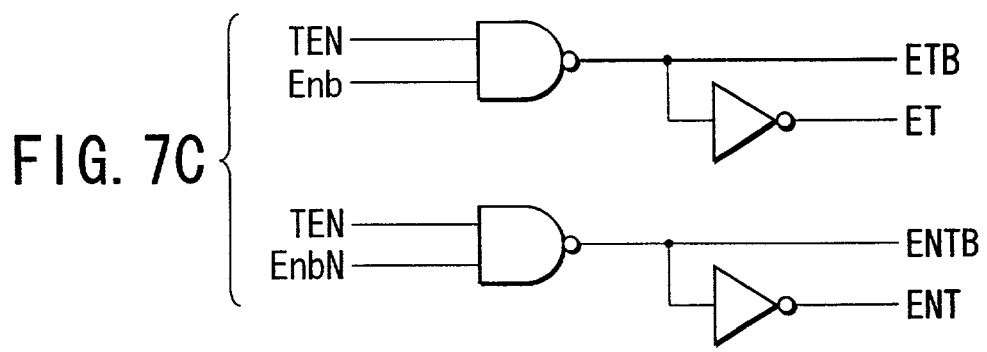
FIG. 7C is a circuit diagram illustrating circuits for generating control signals.

As shown in FIG. 7B, a selection section 80 is controlled by the test enable signal TE, a control signal ET and control signal ENT. As shown in FIG. 7C, the control signal ET is the inverted signal of the NAND operation result of the inverted test enable signal TEN and enable signal Enb. The inverted signal of the control signal ET is a control signal ETB. Further, the control signal ENT is the inverted signal of the NAND operation result of the inverted test enable signal TEN and inverted enable signal EnbN. The inverted signal of the control signal ENT is a control signal ENTB.

As shown in FIG. 7B, the selection section 80 includes clocked NAND gates 81 and 82 and a clocked inverter 83. The clocked NAND gate 81 operates when the control signal ENT has been asserted, thereby outputting the NAND operation result of the reset signal RN and the inverted output signal QN of the flip-flop circuit 10 inverted by an inverter 13. The clocked NAND gate 82 operates when the control signal ET has been asserted, thereby outputting the NAND operation result of the reset signal RN and input data signal DI. The clocked inverter 83 operates when the test enable signal TE has been asserted, thereby inverting the test signal TI. The clocked NAND gates 81 and 82 and clocked inverter 83 have their output nodes connected to each other. This connection node is connected to the input node of the master latch circuit 60.

The operation of the input signal selection section 80 constructed as above will be described.

The clocked NAND gate 81 operates when the control signal ENT has been asserted. The control signal ENT is the inverted signal of the NAND operation result of the inverted test enable signal TEN and inverted enable signal EnbN. Accordingly, the control signal ENT is asserted only if both the test enable signal TE and enable signal Enb are negated.

The clocked NAND gate 82 operates when the control signal ET has been asserted. The control signal ET is the inverted signal of the NAND operation result of the inverted test enable signal TEN and enable signal Enb. Accordingly, the control signal ET is asserted only if the test enable signal TE is negated and the enable signal Enb is asserted.

The clocked inverter 83 operates when the test enable signal TE has been asserted.

The clocked NAND gates 81 and 82 and the clocked inverter 83 assume the following states. If the test enable signal TE is asserted, only the clocked inverter 83 is operative unconditionally, whereas the clocked NAND gates 81 and 82 are inoperative. If the test enable signal TE is negated and the enable signal Enb is asserted, the clocked NAND gate 82 is operative and the clocked NAND gate 81 is inoperative. Further, if both the test enable signal TE and enable signal Enb are negated, the clocked NAND gate 81 is operative and the clocked NAND gate 82 is inoperative. In other words, the test enable signal TE determines, as a top priority, the operative or inoperative state of the clocked inverter 83. If the clocked inverter 83 is inoperative, the enable signal Enb determines the states of the clocked NAND gates 81 and 82 so that only one of them is operative.

Accordingly, if the test enable signal TE is asserted, the clocked NAND gates 81 and 82 are inoperative, and only the clocked inverter 83 is operative. In this state, the latch circuit 30 latches the test signal TI, thereby causing the flip-flop circuit 10 to execute the test operation.

If the test enable signal TE is negated, the clocked inverter 83 is inoperative, and only one of the clocked NAND gates 81 and 82 is operative. Thus, if the reset signal RN is asserted, it is captured by one of the clocked NAND gates. As a result, the flip-flop circuit 10 executes the clear operation.

If the test enable signal TE and reset signal RN are negated and the enable signal Enb is asserted, only the clocked NAND gate 82 is operative. Accordingly, the flip-flop circuit 10 executes the data input operation in which the latch circuit 30 latches the data signal DI.

If the test enable signal TE, enable signal Enb and reset signal RN are all negated, only the clocked NAND gate 81 is operative, thereby causing the flip-flop circuit 10 to execute the output feedback operation.

As described above, the circuit as shown in FIG. 7B can operate in the same manner and provide the same advantage as the first embodiment. Moreover, in this embodiment, only one logic gate exists on the path for the input data signal DI extending from the input terminal to the latch circuit. Therefore, the input data path and hence the setup time can be further shortened.

As described above, in the flip-flop circuits of the first to fifth embodiments, the number of logic circuits existing on the input path for an input data signal can be reduced, thereby shortening the input path and hence the setup time. As a result, the operation speed of the flip-flop circuit can be increased, and the structure of the circuit can be simplified.

Moreover, since an inverter serving as a delay cell is provided on the path for passing the test signal TI of top priority, the test signal TI can be delayed. This enables the problem due to a clock skew to be suppressed without complicating the structure of the flip-flop circuit, and hence enables the test operation of the flip-flop circuit to be highly reliable.

Figure 8A:
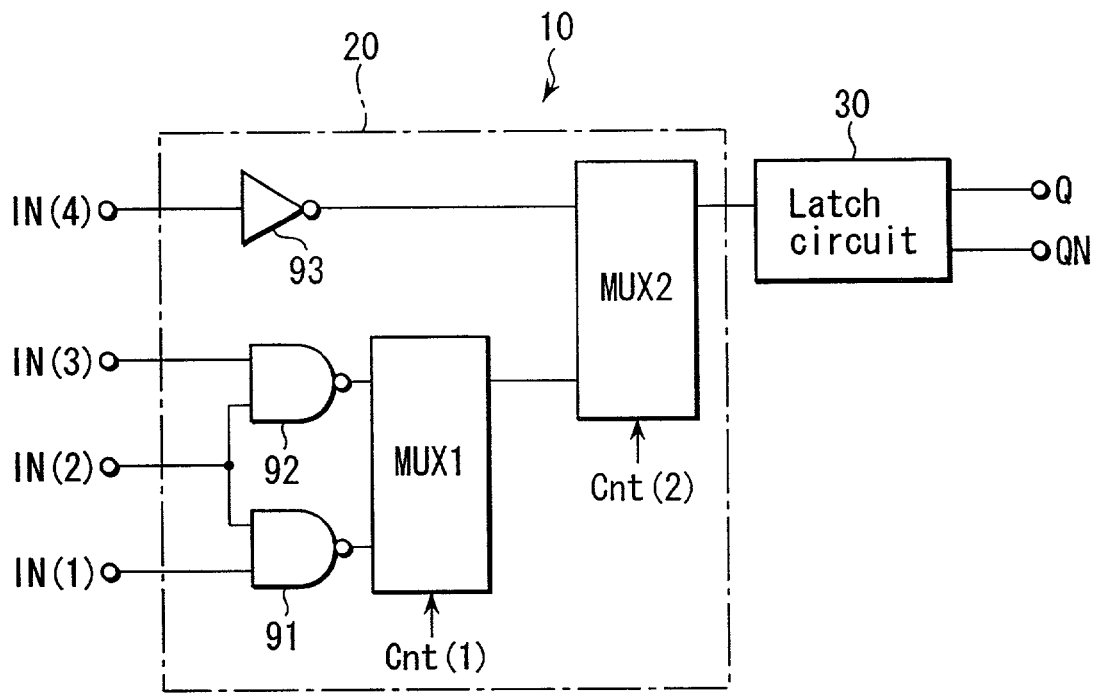
FIGS. 8A and 8B are circuit diagrams illustrating flip-flop circuits according to modifications of the first to fifth embodiments of the invention.

Although in the above-described embodiments, the order of priority is the test operation, clear operation, output and data input operation and feedback operation, the embodiments are naturally not limited to this order. This point will be explained with reference to FIG. 8A. FIG. 8A is a circuit diagram illustrating a four-input flip-flop circuit.

As shown, the input signal selection section 20 selects one of the signals input through input terminals IN(1)–IN(4), and the latch circuit 30 latches the selected input signal. In the input signal selection section 20, a NAND gate 91 executes a NAND operation on the signals input from the input terminals IN(1) and IN(2). Further, a NAND gate 92 executes a NAND operation on the signals input from the input terminals IN(2) and IN(3). A multiplexer MUX1 selects one of the output signals of the NAND gates 91 and 92. Further, an inverter 93 inverts the signal input from the input terminal IN(4), and a multiplexer MUX2 selects either the inverted signal or the signal selected by the multiplexer MUX1. A signal of top priority is input from the input terminal IN(4), and a signal of second priority is input from the input terminal IN(2). Accordingly, if the clear operation is top priority, it is sufficient if the reset signal RN is input from the input terminal IN(4). If the test operation is second priority, the test signal TI is input from the input terminal IN(2).

Figure 8B:
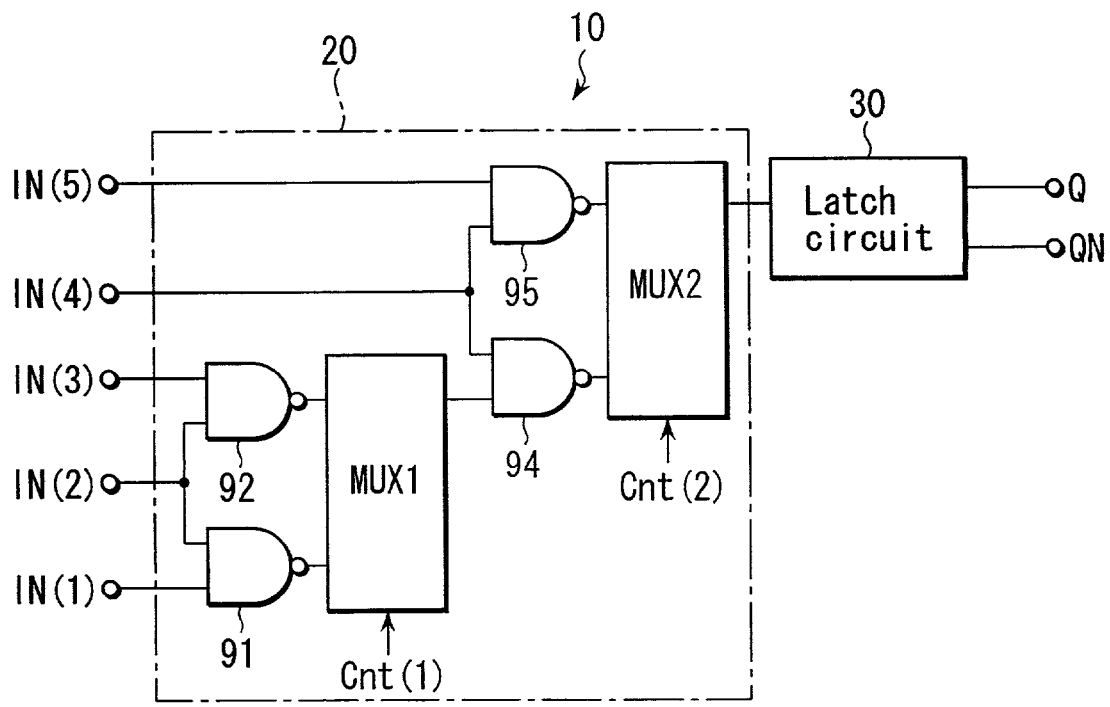

Further, although in the above embodiment, a description has only been given of a four-input flip-flop circuit, the embodiments are, naturally, not limited to four-input circuits. If, for example, a three-input flip-flop circuit is used, the input terminal IN(4) and multiplexer MUX2 in FIG. 8A are not necessary. FIG. 8B is a circuit diagram illustrating a five-input flip-flop circuit.

The flip-flop circuit 10 shown in FIG. 8B is obtained by adding NAND gates 94 and 95 to the flip-flop circuit of FIG. 8A. The NAND gate 94 executes a NAND operation on the signal input from the input terminal IN(4) and the output signal of the multiplexer MUX1. The NAND gate 95 executes a NAND operation on the signals input from the input terminals IN(4) and IN(5). The multiplexer MUX2 selects one of the output signals of the NAND gates 94 and 95. The latch circuit 30 latches the signal selected by the multiplexer MUX2. In this circuit configuration, it is sufficient if input signals of top priority, second priority and third priority are input from the input terminals IN(4), IN(5) and IN(2), respectively.

It is a matter of course that the embodiment of the invention is applicable even to a flip-flop with more than 5 input terminals, by the same method as the above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flip-flop circuit comprising:
    a first logic gate which executes a logic operation on a first data signal and a first control signal;
    a second logic gate which executes a logic operation on a second data signal and the first control signal, the operation results of the first and second logic gates being forcibly fixed to a predetermined value irrespective of the first and second data signals, if the first control signal is asserted;
    a first selection circuit which selects one of the operation results of the first and second logic gates, and outputs the selected operation result as a first selection signal, the first selection circuit selecting the result of the first logic gate when a first enable signal from outside the flip-flop circuit is asserted;
    a latch circuit which latches the first selection signal;
    a third logic gate which executes a logic operation on a third data signal and a second control signal;
    a fourth logic gate which executes a logic operation on a fourth data signal and the second control signal, the operation results of the third and fourth logic gates being forcibly fixed to a predetermined value irrespective of the third and fourth data signals, the second selection circuit selecting the result of the fourth logic gate when a second enable signal from outside the flip-flop circuit is asserted; and
    a second selection circuit which selects one of the operation results of the third and fourth logic gates, and outputs the selected operation result as a second selection signal, the second selection signal being out of the first and second data signals.

2. The flip-flop circuit according to claim 1, wherein:
    the first selection circuit selects and operates one of the first and second logic gates, thereby outputting the selected operation result as the first selection signal; and
    the first selection circuit makes the first and second logic gates operative and inoperative, respectively, to cause the latch circuit to latch the first data signal, the first selection circuit making the first and second logic gates inoperative and operative, respectively, to cause the latch circuit to latch the second data signal, and the first selection circuit making one of the first and second logic gates operative, if the first control signal is asserted.

3. The flip-flop circuit according to claim 1, wherein the first control signal is a negative logic signal, and each of the first and second logic gates executes a NAND operation.

4. The flip-flop circuit according to claim 1, further comprising a third selection circuit which selects one of a fifth data signal and the first selection signal, thereby outputting the selected signal as a third selection signal, and wherein the third selection circuit selects the fifth data signal in preference to the first selection signal, and the latch circuit latches the third selection signal.

5. The flip-flop circuit according to claim 4, further comprising an inverter which inverts the fifth data signal and supplies the inverted fifth data signal to the third selection circuit.

6. The flip-flop circuit according to claim 1, wherein the latch circuit supplies the first selection signal to the third logic gate as the third data signal.

7. A flip-flop circuit comprising:
    a latch circuit which latches a signal;
    a first logic gate which is input a first data signal and operates in response to a first control signal, the first control signal being asserted to make the latch circuit latch the first data signal;
    a second logic gate which executes a logic operation on a second data signal and a second control signal; and
    a third logic gate which executes a logic operation on a third data signal and the second control signal, the logic operation results of the second and third logic gates being forcibly fixed to a predetermined value irrespective of the second and third data signals, if the second control signal is asserted, the second and third logic gates being inoperative unconditionally if the first control signal is asserted, only one of the second and third logic gates being made operative in response to a third control signal used to determine whether the latch circuit should latch the second or third data signal, if the first control signal is negated, output nodes of the first to third logic gates being connected to each other, a signal at a connection between the output nodes being latched by the latch circuit.

8. The flip-flop circuit according to claim 7, wherein the latch circuit supplies the third logic gate with the latched signal as the third data signal.

9. A flip-flop circuit comprising:
    a latch circuit which latches a signal;
    a first logic gate which executes a NAND operation on the signal latched by the latch circuit and a reset signal, the reset signal being a negative logic signal and being asserted when a clear operation is executed for forcibly resetting the latch circuit;
    a second logic gate which executes a NAND operation on the reset signal and a data signal input during a data input operation;

a first selection circuit which selects one of the NAND operation results of the first and second logic gates, and outputs the selected operation result as a first selection signal, the first selection circuit selecting the result of the second logic gate when an enable signal from outside the flip-flop circuit is asserted;

a first inverter which inverts a test signal input during a test operation; and a second selection circuit which selects one of the first selection signal and the test signal inverted by the first inverter, and outputs the selected signal as a second selection signal, the signal latched by the latch circuit being the second selection signal, the second selection circuit selecting the test signal if a test enable signal for enabling the test operation is asserted, and selecting the first selection signal if the test enable signal is negated.

10. The flip-flop circuit according to claim 9, wherein:

the first selection circuit selects and operates one of the first and second logic gates in response to the enable signal, thereby outputting one of the logic operation result of the selected one of the first and second logic gates; and the first selection circuit makes the second and first logic gates operative and inoperative, respectively, if the enable signal is asserted, and makes the second and first logic gates inoperative and operative, respectively, if the enable signal is negated.

11. The flip-flop circuit according to claim 9, wherein the first selection circuit includes first and second transfer gates having respective input nodes connected to output nodes of the first and second logic gates, and also having output nodes connected to each other, the first and second transfer gates being opened/closed by an enable signal for enabling the data input operation.

12. The flip-flop circuit according to claim 9, wherein the second selection circuit includes first and second clocked inverters having respective input nodes connected to output nodes of the first inverter and the first selection circuit, and also having output nodes connected to each other, the first and second clocked inverters being made operative/inoperative by the test enable signal.

13. The flip-flop circuit according to claim 9, wherein the second selection circuit includes third and fourth transfer gates having respective input nodes connected to output nodes of the first inverter and the first selection circuit, and also having output nodes connected to each other, the third and fourth transfer gates being opened/closed by the test enable signal.

14. A flip-flop circuit comprising:

a latch circuit which latches a signal;

a first logic gate which is made operative each time a test enable signal for enabling a test operation is asserted, thereby inverting a test signal input during the test operation;

a second logic gate which executes a NAND operation on the signal latched by the latch circuit and a reset signal, the reset signal being a negative logic signal and being asserted when a clear operation is executed for forcibly resetting the latch circuit; and a third logic gate which executes a NAND operation on the reset signal and a data signal input during a data input operation, the second and third logic gates being made inoperative unconditionally if the test enable signal is asserted, only one of the second and third logic gates being made operative in response to a control signal created by a logic operation executed on the test enable signal and an enable signal for enabling the data input operation, if the test enable signal is negated, output nodes of the first to third logic gates being connected to each other, a signal at a connection between the output nodes being latched by the latch circuit.

* * * * *